US007102456B2

(12) United States Patent
Berg

(10) Patent No.: US 7,102,456 B2
(45) Date of Patent: Sep. 5, 2006

(54) TRANSMISSION LINE

(75) Inventor: Håkan Berg, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 11/298,748

(22) Filed: Dec. 12, 2005

(65) Prior Publication Data

US 2006/0091982 A1 May 4, 2006

Related U.S. Application Data

(63) Continuation of application No. PCT/SE03/01005, filed on Jun. 13, 2003.

(51) Int. Cl.
*H03H 7/38* (2006.01)

(52) U.S. Cl. .................. 333/4; 333/5; 333/33; 333/238

(58) Field of Classification Search .................... 333/4, 333/5, 33, 238
See application file for complete search history.

(56) References Cited

U.S. PATENT DOCUMENTS 5,594,393 A * 1/1997 Bischof ....................... 333/26
2002/0084876 A1 7/2002 Wright et al. ............... 333/238

FOREIGN PATENT DOCUMENTS

| | | |
|---|---|---|
| DE | 24 44 228 | 3/1976 |
| GB | 2 229 322 | 9/1990 |
| JP | 3119803 | 5/1991 |
| JP | 2001-196814 | 7/2001 |

OTHER PUBLICATIONS

International Search Report for PCT/SE2003/001005 dated Dec. 10, 2003.

* cited by examiner

*Primary Examiner*—Stephen E. Jones
(74) *Attorney, Agent, or Firm*—Nixon & Vanderhye P.C.

(57) ABSTRACT

A method of controlling a characteristic impedance of a transmission line, and a transmission line implementing the method. According to a basic version of the invention a distance between longitudinal currents are controlled, thereby controlling a characteristic inductance of the transmission line. This without hindering transversal currents on which a characteristic capacitance is dependent upon. This is achieved by cutting longitudinal currents within a minimum distance between the longitudinal currents and leaving longitudinal currents that have a distance greater than the minimum distance alone. This is done without cutting transversal currents to any significant degree. The longitudinal currents can be cut in the return conductor and/or in the signal strip, in dependence on the type of transmission line.

27 Claims, 5 Drawing Sheets

TRANSMISSION LINE

This is a continuation application of PCT/SE03/01005, filed 13 Jun. 2003, which designated the U.S., the entire contents of which are hereby incorporated by reference.

TECHNICAL FIELD

The invention concerns transmissions lines and is more particularly directed to a method of controlling a characteristic impedance and of controlling an electrical length of a transmission line, and a transmission line and a transmission line based component implementing the method.

BACKGROUND

High frequency circuits, in the microwave range and higher, suitably use transmission lines and transmission line based components such as resonators, matching networks, and power splitters. When designing a transmission line based circuit, important parameters of the transmission line are a characteristic impedance and an electrical length of the transmission line. The electrical length is given by the physical length and the dielectric permittivity of the materials involved, normally the substrate. There is a desire to be able to change the electrical length without having to change the physical length or the substrate material used. A method of attaining this is to connect lumped capacitors periodically to thereby increase the effective permittivity of the transmission line. Connecting lumped capacitors will unfortunately cause the impedance of the transmission line to drop since the characteristic impedance of a transmission line is inversely proportional to the characteristic capacitance of the transmission line, i.e. when the characteristic capacitance increases, then the characteristic impedance decreases. To counteract this, and in cases where a substrate makes it difficult to achieve arbitrary characteristic impedance levels, the width of the signal strip can be decreased to raise the characteristic inductance and thereby raise the characteristic impedance. However, there can be problems with having to decrease the width of the signal strip. It can for example be necessary to decrease the width down to widths that are impossible to manufacture. Narrower signal strips will also have increased losses, which in most cases is very undesirable. In some transmission lines the characteristic impedance can be raised by decreasing the distance between a signal strip and a return conductor/ground plane. This will not change the electrical length of the transmission line. Unfortunately this will also, in most cases, influence the characteristic inductance and other characteristics of the transmission line in a negative manner. There seems to be room for improvement of how to control an electrical length and a characteristic impedance of a transmission line.

SUMMARY

An object of the invention is to define a method and a transmission line which overcome the above mentioned drawbacks.

Another object of the invention is to define a method of and a transmission line that can control a characteristic impedance and an electrical length.

A further object of the invention is to define a method of and a transmission line that can control a characteristic inductance and a characteristic capacitance largely independently of each other.

The aforementioned objects are achieved according to the invention by a method of controlling a characteristic impedance of a transmission line. According to a basic version of the invention a distance between longitudinal currents are controlled, thereby controlling a characteristic inductance of the transmission line. This without hindering transversal currents upon which a characteristic capacitance is dependent. This is achieved by cutting longitudinal currents within a minimum distance between the longitudinal currents and leaving alone longitudinal currents that have a distance greater than the minimum distance. This is done without cutting transversal currents to any significant degree. The longitudinal currents can be cut in the return conductor and/or in the signal strip, in dependence on the type of transmission line. A transmission line according the method is also disclosed.

The aforementioned objects are also achieved by a method of controlling a characteristic impedance of a transmission line. The transmission line comprises a signal strip and a return conductor spaced apart a predetermined distance. The characteristic impedance comprises a characteristic inductance part and a characteristic capacitance part. The characteristic inductance part is dependent on a distance between longitudinal currents of the signal strip and longitudinal currents of the return conductor. The characteristic capacitance part is dependent on transverse currents on effective facing areas of the signal strip and the return conductor. According to the invention the method comprises controlling a nearest distance between longitudinal currents of the signal strip and longitudinal currents of the return conductor, thereby controlling the characteristic inductance part. This is accomplished, while keeping the same predetermined distance between the signal strip and the return conductor, by creating at least two non-conducting discontinuities, i.e. insulating portions, in the return conductor. The at least two discontinuities extend from parts of the return conductor closest to the signal strip and away from the signal strip a length sufficient to controllably increase the nearest distance between the longitudinal currents of the signal strip and the longitudinal currents of the return conductor due to a movement of the longitudinal currents of the return conductor away from the longitudinal currents of the signal strip. The at least two discontinuities extending in such a way as to allow transverse currents between the discontinuities. For example, in a transmission line of a microstrip type, the non-conducting discontinuities must extend across the whole projection of the signal strip onto the ground plane, and a bit more, to be able to start to increase the distance between the closest longitudinal currents.

The method suitably comprises distributing a plurality of non-conducting discontinuities along the return conductor of the transmission line. The non-conducting discontinuities should preferably be of a width and being spaced apart a center to center distance such that losses due to unwanted radiation through the non-conducting discontinuities are avoided or minimized. The method according to the invention is not directed to radiation through the non-conducting discontinuities or the effects that would be the result of such radiation. The invention is directed to minimize losses, and thus minimize or avoid completely any radiation through the non-conducting discontinuities. The usable range of widths of and distances between the non-conducting discontinuities will depend on the frequency range used, the size of the signal strip and return conductor and the distance between them.

Suitably the method can further comprise controlling the nearest distance between longitudinal currents of the signal strip and longitudinal currents of the return conductor, thus varying the characteristic inductance part, by varying the lengths of the non-conducting discontinuities. The lengths should be varied within a range so that the nearest distance between the longitudinal currents of the signal strip and the longitudinal currents of the return conductor varies. The lengths should also be such that a maximum vector of the lengths is less than a width of the return conductor, which maximum vector is perpendicular to the longitudinal currents, i.e. the return conductor should not be cut off.

In some versions the method further comprises controlling the nearest distance between longitudinal currents of the signal strip and longitudinal currents of the return conductor, thus varying the inductance, by varying distances between the non-conducting discontinuities. Then in some versions the distances between the non-conducting discontinuities can be varied by varying a width of the non-conducting discontinuities closest to the longitudinal currents of the return conductor. Then most suitably the widths of the non-conducting discontinuities are varied closest to the longitudinal currents of the return conductor in such a way that the non-conducting discontinuities are wider closest to the longitudinal currents of the return conductor.

In some versions the method suitably further comprises controlling the effective facing areas of the signal strip and the return conductor, thereby controlling the characteristic capacitance part, by varying a width of the non-conducting discontinuities. The method can also further comprise controlling the effective facing areas of the signal strip and the return conductor, thereby controlling the characteristic capacitance part, by varying a center to center distance of the non-conducting discontinuities. In most versions the non-conducting discontinuities are slots which are at least substantially parallel to the transversal currents.

In some advanced versions the method further comprises controlling the nearest distance between longitudinal currents of the signal strip and longitudinal currents of the return conductor, thereby controlling the characteristic inductance part, while keeping the same predetermined distance between the signal strip and the return conductor, by creating at least two non-conducting discontinuities in the signal strip. The at least two discontinuities of the signal strip extend from parts of the signal strip closest to the longitudinal currents of the return conductor and away therefrom to controllably increase the nearest distance between the longitudinal currents of the signal strip and the longitudinal currents of the return conductor due to a movement of the longitudinal currents of the signal strip away from the longitudinal currents of the return conductor. The at least two discontinuities of the signal strip extend in such a way as to allow transverse currents between the discontinuities in the signal strip. Suitably the method comprises distributing a plurality of non-conducting discontinuities of the signal strip along the signal strip of the transmission line. The non-conducting discontinuities of the signal strip are of a width and being spaced apart a center to center distance such that losses due to radiation through the non-conducting discontinuities of the signal strip are avoided or minimized. Preferably the method comprises matching the non-conducting discontinuities of the signal strip to the non-conducting discontinuities of the return conductor in such a way as to maximize the effective facing areas of the signal strip to the return conductor. In most versions the non-conducting discontinuities of the signal strip are slots which are at least substantially parallel to the transversal currents.

One or more of the features of the above-described different methods according to the invention can be combined in any desired manner, as long as the features are not contradictory.

The aforementioned objects are also achieved by a method of controlling an electrical length of a transmission line. The transmission line comprises a signal strip and a return conductor spaced apart a predetermined distance. According to the invention the method comprises controlling a characteristic impedance of the transmission line according to any one of the above-described methods, to thereby control the electrical length of the transmission line.

The aforementioned objects are also achieved according to the invention by a transmission line with a controllable characteristic impedance. The transmission line comprises a signal strip and a return conductor spaced apart a predetermined distance. The characteristic impedance comprises a characteristic inductance part and a characteristic capacitance part. The characteristic inductance part is dependent on a distance between longitudinal currents of the signal strip and longitudinal currents of the return conductor. The characteristic capacitance part is dependent on transverse currents on effective facing areas of the signal strip and the return conductor. According to the invention the characteristic impedance of the transmission line is controlled by varying a nearest distance between longitudinal currents of the signal strip and longitudinal currents of the return conductor. Thereby controlling the characteristic inductance part, while keeping the same predetermined distance between the signal strip and the return conductor, by an introduction of at least two non-conducting, insulating, discontinuities in the return conductor. The at least two discontinuities extend from parts of the return conductor closest to the signal strip and away from the signal strip a length sufficient to controllably increase the nearest distance between the longitudinal currents of the signal strip and the longitudinal currents of the return conductor due to a movement of the longitudinal currents of the return conductor away from the longitudinal currents of the signal strip. The at least two discontinuities extend in such a way as to allow transverse currents between the discontinuities.

In most embodiments the transmission line comprises a plurality of non-conducting discontinuities distributed along the return conductor. The non-conducting discontinuities are most suitably of a width and are spaced apart a center to center distance such that losses due to radiation through the non-conducting discontinuities are avoided or minimized.

In some embodiments the characteristic impedance of the transmission line is further controlled by varying the lengths of the non-conducting discontinuities. The lengths are suitably varied within a range so that the nearest distance between the longitudinal currents of the signal strip and the longitudinal currents of the return conductor varies and so that a maximum vector of the lengths is less than a width of the return conductor, which maximum vector is perpendicular to the longitudinal currents.

Suitably in some embodiments the characteristic impedance of the transmission line is further controlled by varying a distance between the non-conducting discontinuities. Then the distance between the non-conducting discontinuities can be varied by varying a width of the non-conducting discontinuities closest to the longitudinal currents of the return conductor. If this is the case then mostly the widths of the non-conducting discontinuities are varied closest to the longitudinal currents of the return conductor in such a way that the non-conducting discontinuities are wider closest to the longitudinal currents of the return conductor.

Additionally in some embodiments the characteristic impedance of the transmission line can be further controlled by varying the effective facing areas of the signal strip and the return conductor, thereby controlling the characteristic capacitance part, by varying a width of the non-conducting discontinuities. Sometimes the characteristic impedance of the transmission line is further controlled by varying the effective facing areas of the signal strip and the return conductor, thereby controlling the characteristic capacitance part, by varying a center to center distance of the non-conducting discontinuities.

In most embodiments the non-conducting discontinuities are slots which are at least substantially parallel to the transversal currents.

In some advanced embodiments the characteristic impedance of the transmission line is further controlled by varying a nearest distance between longitudinal currents of the signal strip and longitudinal currents of the return conductor, thereby controlling the characteristic inductance part, while keeping the same predetermined distance between the signal strip and the return conductor by an introduction of at least two non-conducting discontinuities in the signal strip. The at least two discontinuities of the signal strip extend from parts of the signal strip closest to the longitudinal currents of the return conductor and away therefrom to controllably increase the nearest distance between the longitudinal currents of the signal strip and the longitudinal currents of the return conductor due to a movement of the longitudinal currents of the signal strip away from the longitudinal currents of the return conductor. The at least two discontinuities of the signal strip extend in such a way as to allow transverse currents between the discontinuities. The transmission line most suitably comprises a plurality of non-conducting discontinuities distributed along the signal strip. The non-conducting discontinuities of the signal strip are preferably of a width and are spaced apart a center to center distance such that losses due to radiation through the non-conducting discontinuities of the signal strip are avoided or minimized. Suitably the non-conducting discontinuities of the signal strip are matched to the non-conducting discontinuities of the return conductor in such a way as to maximize the effective facing areas of the signal strip to the return conductor. In most embodiments the non-conducting discontinuities of the signal strip are slots which are at least substantially parallel to the transversal currents.

The features of the above-described different embodiments of a transmission line according to the invention can be combined in any desired manner, as long as no conflict occurs.

The aforementioned objects are also achieved according to the invention by a transmission line with a controllable electrical length. According to the invention the transmission line comprises a transmission line with a controllable characteristic impedance according to any one of the above-described embodiments of transmission lines, to thereby control the electrical length.

The aforementioned objects are further achieved according to the invention by a transmission line based component such as a resonator, matching network, or power splitter. According to the invention the transmission line based component comprises a transmission line according to any one of the described embodiments of transmission lines.

By providing a method of controlling a characteristic impedance, and electrical length of a transmission line and a transmission line and transmission line based components with controllable characteristic impedances and electrical lengths according to the invention a plurality of advantages over prior art methods and systems are obtained. Primary purposes of the invention are to be able to change/control characteristic impedances and electrical lengths without having to change the physical dimensions, or having to change the signal strip to return conductor inter-distances, or having to change substrate materials. According to the invention this is enabled primarily by moving the longitudinal currents of the signal strip and of the return conductor apart. This is accomplished according to the invention without having to move the signal strip and the return conductor apart, and without any substantial influence on the transversal currents on which the characteristic capacitance is dependent upon, i.e. an increase in the characteristic inductance can be accomplished without the customary decrease in the characteristic capacitance. By enabling a change in the characteristic impedance without substantially influencing the characteristic capacitance, the electrical length can be controlled efficiently. This is especially important when there is a need to increase the electrical length, i.e. increasing the characteristic impedance, to enable small, short, physical size of transmission lines and especially transmission line based components. Other advantages of this invention will become apparent from the description.

BRIEF DESCRIPTION OF THE DRAWINGS

The invention will now be described in more detail for explanatory, and in no sense limiting, purposes, with reference to the following figures, in which.

DETAILED DESCRIPTION

In order to clarify the method and device according to the invention, some examples of its use will now be described in connection with FIGS. 1 to 5.

Figure 1A:
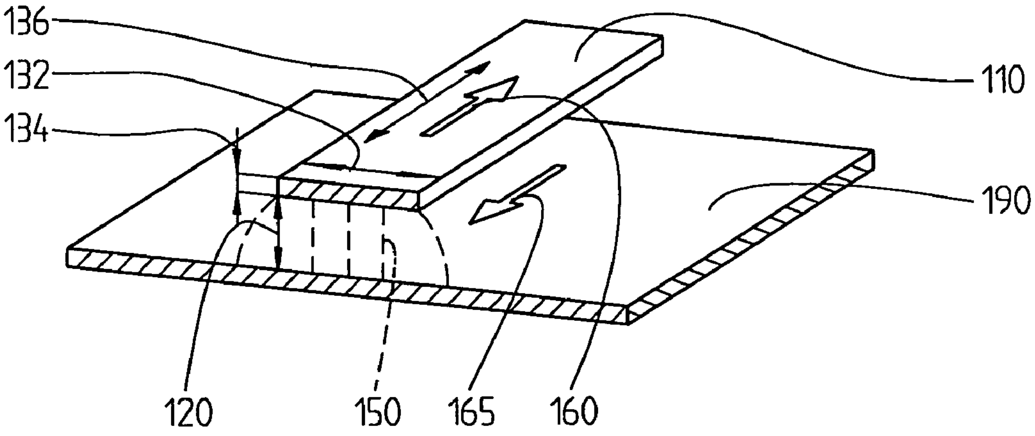
FIGS. 1A–1C illustrate examples of transmission lines in the form of microstrip, coplanar waveguide (CPW), and coplanar strip line (CPS)
Figure 1B:
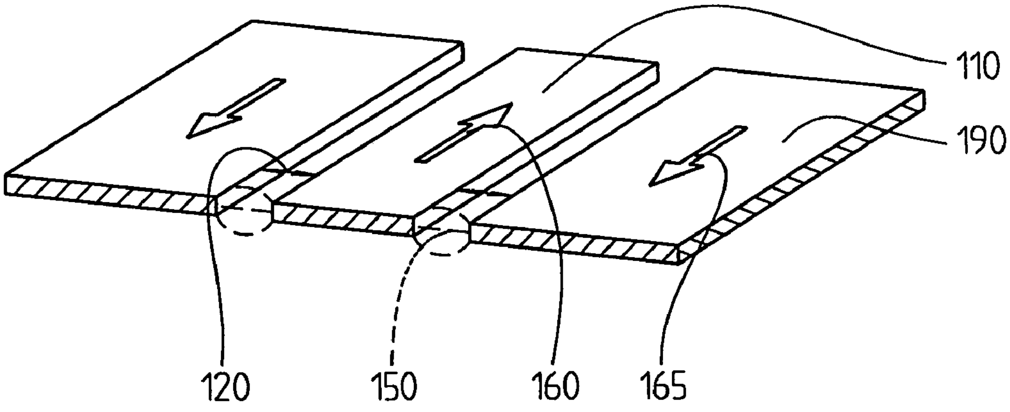
Figure 1C:
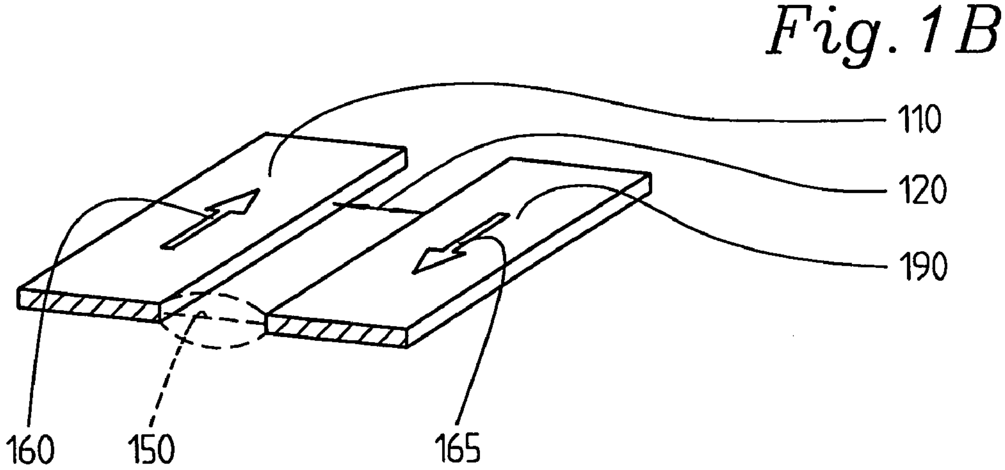

FIGS. 1A, 1B, and 1C illustrate different examples of transmission lines to which the invention can suitably be applied. FIG. 1A illustrates a transmission line of a microstrip type. FIG. 1B illustrates a transmission line of a coplanar waveguide (CPW) type. FIG. 1C illustrates a transmission line of a coplanar strip line (CPS) type. A transmission line comprises a signal strip 110 and a return conductor 190. The signal strip 110 has a thickness 134, a width 132 and a longitudinal extension 136 and is arranged a distance 120 from the return conductor 190. The return conductor 190 can most commonly be either a ground plane, a partial ground plane, partial ground planes, or a return strip. The signal strip 110 will carry a longitudinal current 160 along the extension 136 of the signal strip 110, i.e. the longitudinal currents 160 are currents in the direction of propagation. The return conductor will carry an equivalent but oppositely directed longitudinal current 165. The characteristic inductance, i.e. the per unit length inductance, is dependent on the longitudinal currents 160, 165, and especially their minimal distance. The closer the longitudinal currents 160, 165 are the smaller the characteristic inductance. The signal strip 110 and the return conductor 190 also comprise transversal currents, which are not shown, which are perpendicular to the longitudinal currents 160, 165 and cause the electrical field 150 between the signal strip 110 and the return conductor 190, upon which the characteristic capacitance, i.e. the per unit length capacitance, is dependent.

The characteristic impedance, i.e. the per unit length impedance, is directly proportional to the characteristic inductance and inversely proportional to the characteristic capacitance. This means that an increase in the characteristic inductance will increase the characteristic impedance, and that an increase in the characteristic capacitance will decrease the characteristic impedance. The electrical length is directly proportional to the characteristic inductance and directly proportional to the characteristic capacitance. This means that an increase in the characteristic inductance will increase the electrical length, and that an increase in the characteristic capacitance will also increase the electrical length. To thereby attain a high characteristic impedance and a long electrical length, one should increase the characteristic inductance and keep the characteristic capacitance substantially at the same level.

One way of increasing the characteristic inductance is to separate the signal strip 110 away from the return conductor 190, i.e. to increase the distance 120 between the signal strip 110 and the return conductor 190. Another method is disclosed in FIG. 2A and FIG. 2B, which illustrate a transmission line of a microstrip type with no return conductor/ground plane 290 underneath the signal strip 210. The vertical distance 220 is kept the same, and the return conductor is moved a clearing distance 222 away from a signal strip 210 projection. This results in an increase in the minimal distance 224 between the longitudinal currents 260, 265. If the return conductor 290 was only removed directly underneath the signal strip or less, then the minimal distance 224 would be equal to the vertical distance 220. The longitudinal currents 260, 265 are thus moved apart, which results in an increased characteristic inductance. However, at the same time we have removed the transversal currents underneath the signal strip 260, resulting in a reduced electrical field 250, thus lowering the characteristic capacitance. This will result in the characteristic impedance increasing but keeping the electrical length substantially the same (assuming, as it is in most cases, that the decrease in the characteristic capacitance is of the same order as the increase of the characteristic inductance).

Figure 3A:
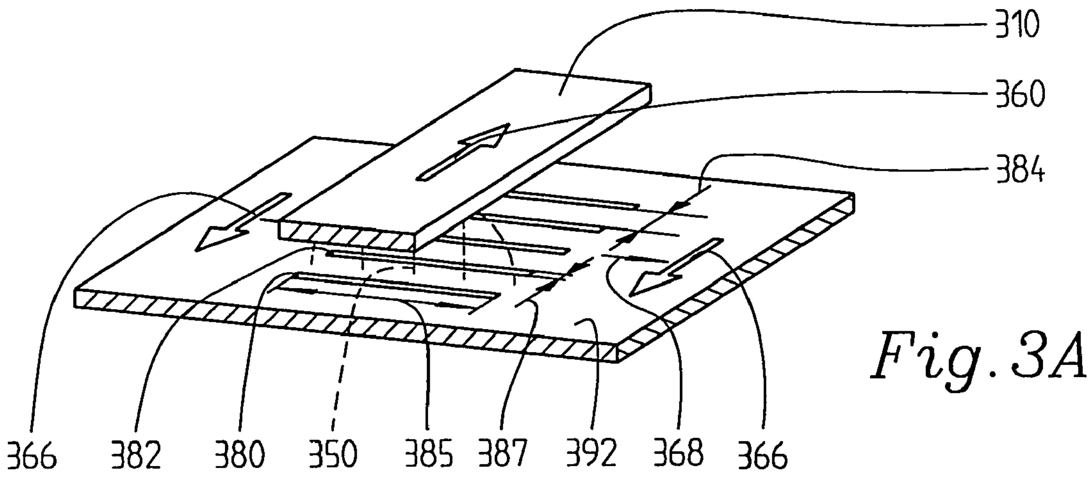
FIGS. 3A–3C illustrate examples of transmission lines according to basic embodiments according to the invention in the form of microstrip, coplanar waveguide (CPW), and coplanar strip line (CPS)
Figure 3B:
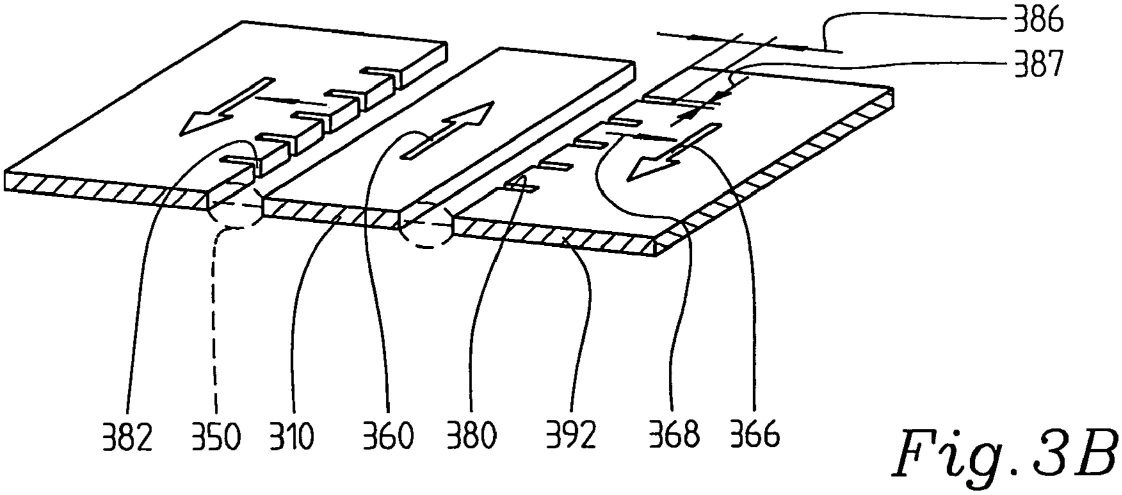
Figure 3C:
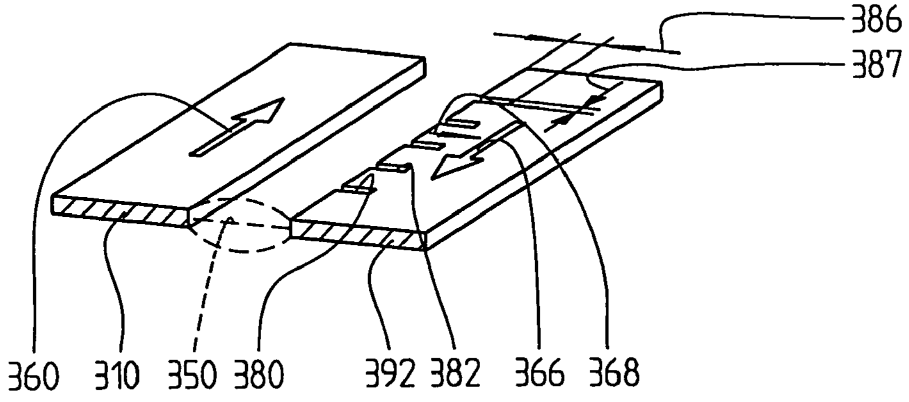

In many applications there is thus a need for a signal strip and a return conductor to be far apart to attain a high characteristic inductance and at the same time be close together to attain the same or a higher characteristic capacitance. According to the invention this can be attained by having the signal strip and the return conductor close together as far as transverse currents are concerned, and at the same time having the signal strip and the return conductor far apart as far as longitudinal currents are concerned. This is accomplished according to the invention by slotting a return conductor orthogonally to the direction of propagation thereby cutting longitudinal currents that are close together and leaving the transversal currents substantially as they were. FIGS. 3A to 3C illustrate examples of transmission lines according to basic embodiments according to the invention. FIG. 3A illustrates a transmission line of the microstrip type. FIG. 3B illustrates a transmission line of the coplanar waveguide (CPW) type. FIG. 3C illustrates a transmission line of the coplanar strip line (CPS) type. Each transmission line comprises a signal strip 310 spaced apart from a return conductor or conductors 392. The longitudinal current 360 of the signal strip 310 is unaffected in these basic embodiments of the invention. According to the invention longitudinal currents which closest to the longitudinal currents 360 of the signal strip 310 are cut off leaving only longitudinal currents 366 further away 368. The longitudinal currents of the return conductor 392 are cut off by means of non-conducting discontinuities/slots 380, 382 according to the invention. The slots 380, 382 in this example have a width 387, an inter-distance 384, and a length 385, 386. The inter-distance 384 allows large facing effective areas and transversal currents to create an electrical field 350 to thereby retain a characteristic capacitance. It is mainly the lengths 385, 386 of the slots 380, 382 that determine how far the longitudinal currents 366 are pushed 368 away from the longitudinal currents 360 of the signal strip 310. The distance 384 between the slots 380, 382 is an important factor as well.

Figure 2A:
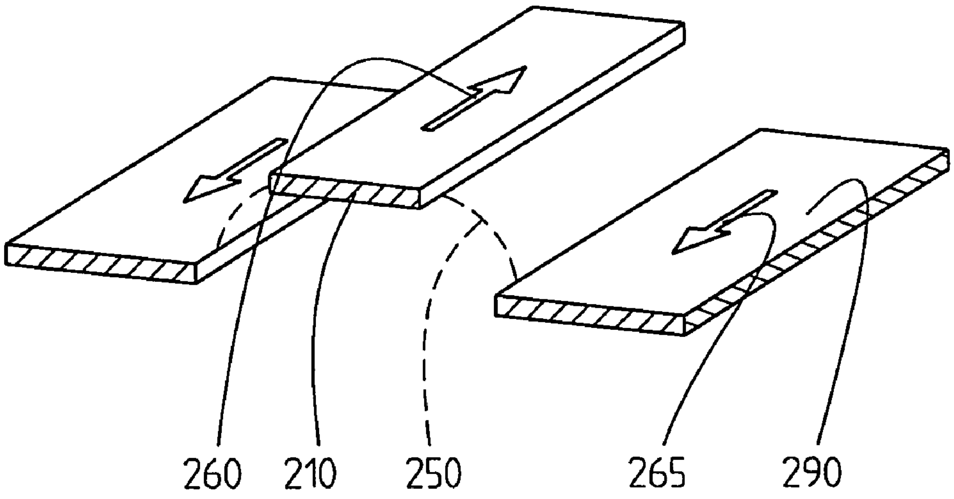
FIGS. 2A–2B illustrate a microstrip with no ground plane underneath it.
Figure 2B:
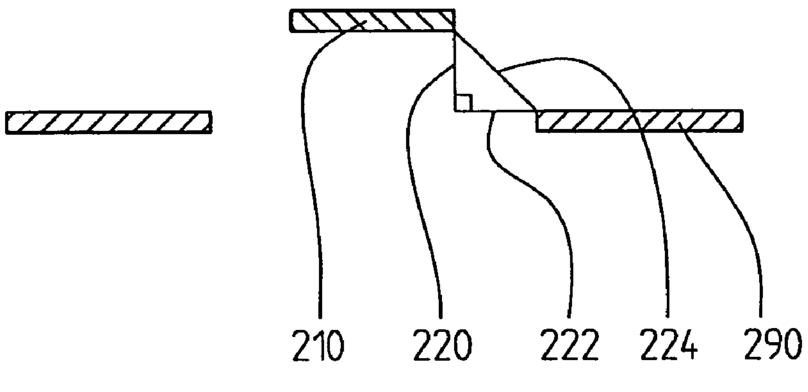

Analogous to the explanation of FIGS. 2A and 2B, if the transmission line is of a microstrip type, then the slots 380, 382 must be of such a length 385 that they extend beyond a projection of the signal strip 310 onto the ground plane 392. The slots 380, 382 must always be of a length 385, 386 such that they can push 368 the longitudinal currents 366 further away from each other.

Figure 4A:
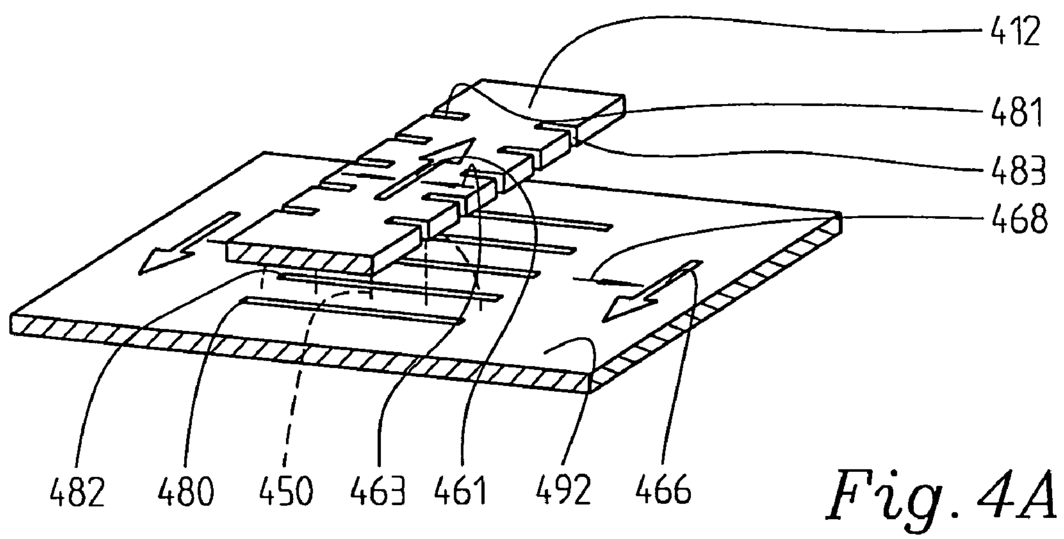
FIGS. 4A–4C illustrate examples of transmission lines according to further embodiments according to the invention in the form of microstrip, coplanar waveguide (CPW), and coplanar strip line (CPS)
Figure 4B:
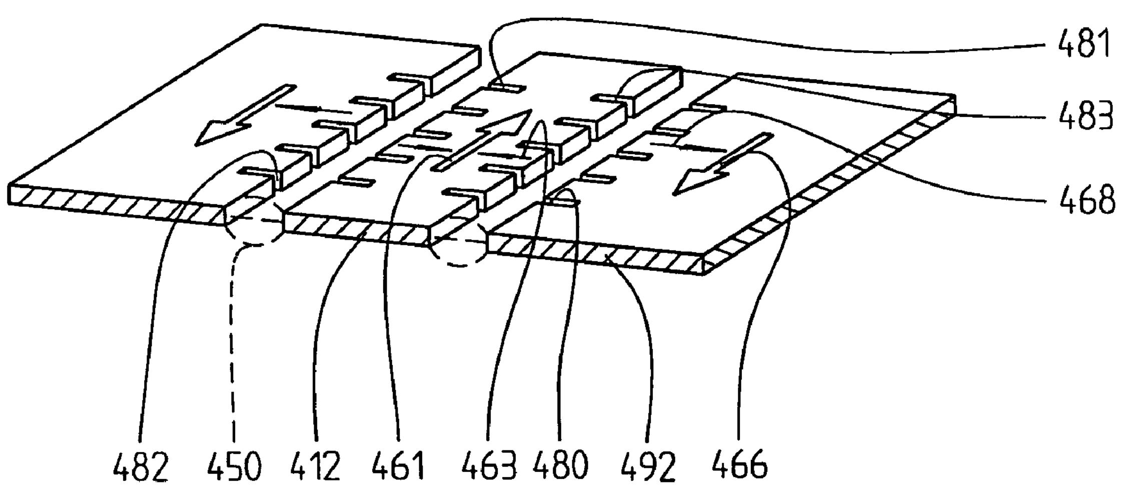
Figure 4C:
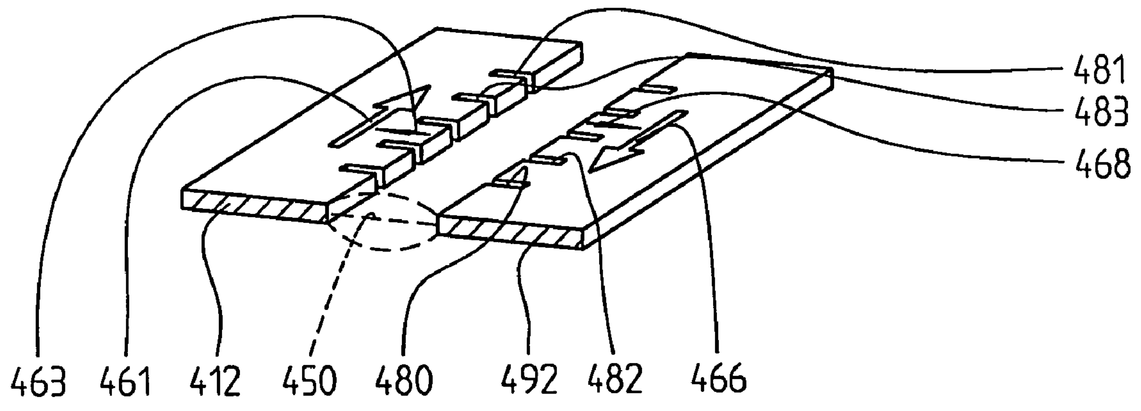

The first basic examples of the invention only involve the shift of longitudinal currents on the return conductors. There is according to the invention the possibility to additionally also, or instead of, push longitudinal currents on the signal strip away from the longitudinal currents of the return conductor. FIGS. 4A to 4C illustrate examples of transmission lines according to further embodiments according to the invention involving cutting off longitudinal currents on the signal strip. FIG. 4A illustrates a transmission line of a microstrip type. Due to the geometry of a microstrip, the longitudinal currents 466 have to be pushed away 468 from underneath the signal strip 412, before any cutting off or pushing 463 of longitudinal currents 461 on the signal strip 412, will have any effect. FIG. 4B illustrates a transmission line of a coplanar waveguide (CPW) type, which can push 463 longitudinal currents 461 on the signal strip 412 only. FIG. 4C illustrates a transmission line of a coplanar strip line (CPS) type, which can push 463 longitudinal currents 461 on the signal strip 412 only. As with pushing 468 the longitudinal currents 466 of the return conductors 492, this is preferably accomplished with slots 481, 483, which will have slightly different physical placements in dependence on the geometry of the transmission line in question. The slots 481, 483 extend from places on the signal strip 412 that are closest to the longitudinal currents 466 of the return conductor 492. The slots 481, 483 will extend as far as the longitudinal currents 461 of the signal strip 412 needs to be pushed/moved 463, without cutting off all of the longitudinal currents 461 of the signal strip 412. The slots 481, 483 of the signal strip 412 are suitably aligned with the slots 480, 482 of the return conductor 492, if there are any, to thereby disrupt the electrical fields 450 as little as possible.

Figure 5A:
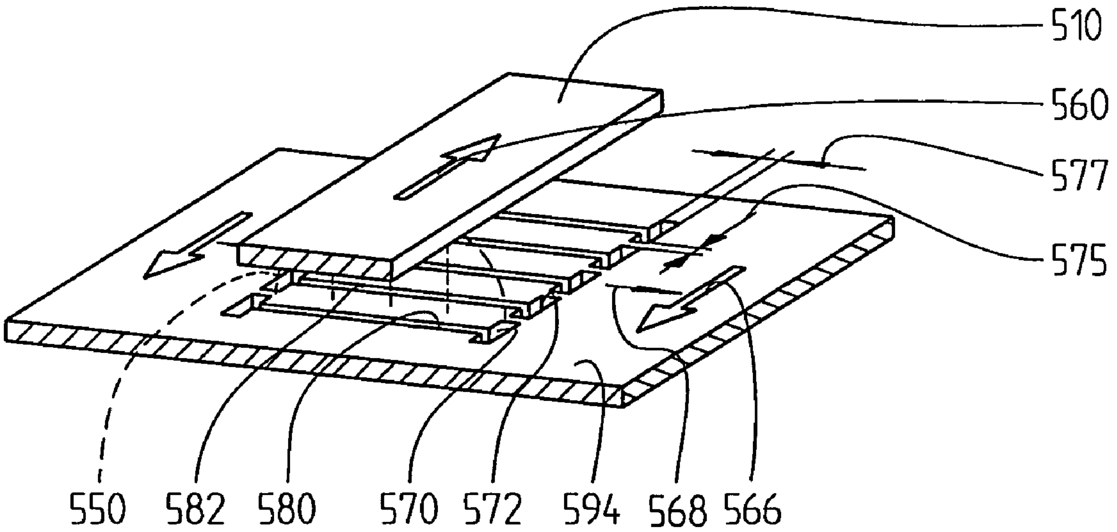
FIGS. 5A–5B illustrate examples of transmission lines according to still further embodiments according to the invention, in the form of microstrip and coplanar waveguide (CPW).
Figure 5B:
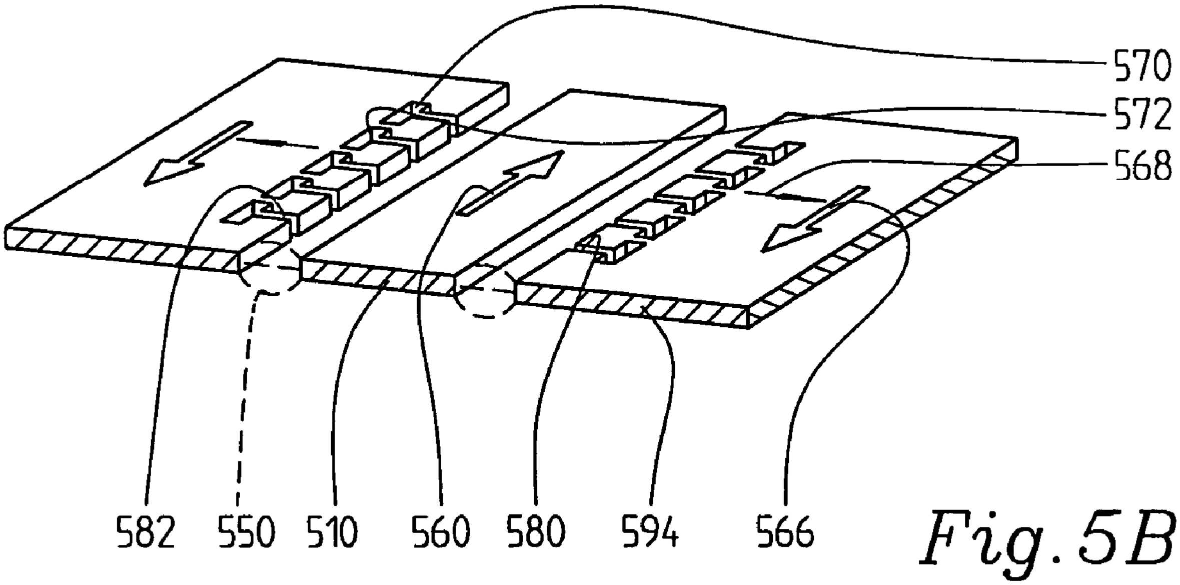

A further way of increasing the push/move of longitudinal currents away from each other while at the same time disrupting the electrical fields between the signal strip and the return conductor as little as possible according to the invention is illustrated in FIGS. 5A and 5B. FIG. 5A illustrates an example of a further embodiment according to the invention with a microstrip type transmission line. FIG. 5B illustrates an example of a further embodiment according to the invention with a coplanar waveguide (CPW) type transmission line. By increasing the widths 570, 572 of the slots 580, 582 only closest to the longitudinal currents 566 that are to be pushed 568, the facing effective surface areas of the signal strip 510 and the return conductor 594 is effected as little as possible while at the same time more effectively pushing 568 the longitudinal currents 566. The longitudinal currents 566 are pushed 568 more effectively since the longitudinal currents 566 will have a harder time to deviate in between 575 the widenings 570, 572. There has to be an opening 575 for the transversal currents, which will then be virtually unaffected, enabling a fair electrical field 550. The length 577 of the widening will in most applications be governed by capacitive coupling problems while at the same time keeping it as small as possible to lessen any impact on the characteristic capacitance.

The description has described how the characteristic capacitance is left virtually unaffected. This will be the most desirable effect in most applications. However, the characteristic capacitance can be controlled by varying the effective facing areas, by, for example, varying the width of the slots over the whole length of the slots.

As a summary, the invention can basically be described as a method, which provides an efficient manner of controlling a characteristic inductance of a transmission line without unduly effecting the characteristic capacitance. This is accomplished by controlling the relative positions of the longitudinal currents while at the same time leaving the transversal currents virtually without change. The invention is not limited to the embodiments described above but may be varied within the scope of the appended patent claims.

FIG. 1A–1C illustrate examples of transmission lines, FIG. 1A—microstrip, FIG. 1B—coplanar waveguide (CPW), and FIG. 1C—coplanar strip line (CPS),

110 signal strip,
120 distance between signal strip and ground plane/return strip,
132 width of signal strip,
134 thickness of signal strip,
136 extension of signal strip,
150 electrical field, due to transverse currents,
160 signal current in signal strip, longitudinal current,
165 return signal current in ground plane/return strip, longitudinal current,
190 ground plane/return strip.

FIGS. 2A–2B illustrate a microstrip with no ground plane underneath the signal strip,

210 signal strip,
220 vertical distance between signal strip and ground plane,
222 horizontal distance between signal strip and ground plane,
224 resulting distance between signal strip and ground plane,
250 electrical field, due to transverse currents,
260 signal current in signal strip, longitudinal current,
265 return signal current in ground plane/return strip, longitudinal current,
290 ground plane/return strip.

FIGS. 3A–3C illustrate examples of transmission lines according to basic embodiments according to the invention, FIG. 3A—microstrip, FIG. 3B—coplanar waveguide (CPW), and FIG. 3C—coplanar strip line (CPS),

310 signal strip,
350 electrical field, due to transverse currents,
360 signal current in signal strip, longitudinal current,
366 moved/pushed return signal current in ground plane/return strip, modified longitudinal current,
368 direction away from longitudinal current of signal strip,
380 a first non-conducting discontinuity/slot according to the invention,
382 a second non-conducting discontinuity/slot according to the invention,
384 distance with ground plane/return strip between non-conducting discontinuities/slots,
385 length of non-conducting discontinuities/slots,
386 length of non-conducting discontinuities/slots in coplanar structures,
387 width of non-conducting discontinuities/slots,
392 ground plane/return strip according to the invention.

FIGS. 4A–4C illustrate examples of transmission lines according to further embodiments according to the invention, FIG. 4A—microstrip, FIG. 4B—coplanar waveguide (CPW), and FIG. 4C—coplanar strip line (CPS),

412 signal strip according to the invention,
450 electrical field, due to transverse currents,
461 moved/pushed signal current in signal strip, modified longitudinal current,
463 direction away form longitudinal current of ground plane/return strip,
466 moved/pushed return signal current in ground plane/return strip, modified longitudinal current,
468 direction away from longitudinal current of signal strip,
480 a first slot according to the invention in the ground plane/return strip,
481 a first slot according to the invention in the signal strip,
482 a second slot according to the invention in the ground plane/return strip,
483 a second slot according to the invention in the signal strip,
492 ground plane/return strip according to the invention.

FIGS. 5A–5B illustrate examples of transmission lines according to still further embodiments according to the invention, FIG. 5A—microstrip, and FIG. 5B—coplanar waveguide (CPW),

510 signal strip,
550 electrical field, due to transverse currents,
560 signal current in signal strip, longitudinal current,
566 moved/pushed return signal current in ground plane/return strip, modified longitudinal current,
568 direction away from longitudinal current of signal strip,
570 a first expansion of the slots,
572 a second expansion of the slots,
575 width/passage of ground plane between expansions,
577 width of expansion/length of passage,
580 a first slot according to the invention,
582 a second slot according to the invention,
594 a further ground plane/return strip according to the invention.

The invention claimed is:

1. A transmission line with a controllable characteristic impedance, the transmission line comprises a signal strip and a return conductor spaced apart a predetermined distance, the characteristic impedance comprises a characteristic inductance part and a characteristic capacitance part, the characteristic inductance part is dependent on a distance between longitudinal currents of the signal strip and longitudinal currents of the return conductor, the characteristic capacitance part is dependent on transverse currents on effective facing areas of the signal strip and the return conductor, characterized in that the characteristic impedance of the transmission line is controlled by varying a nearest distance between longitudinal currents of the signal strip and longitudinal currents of the return conductor, thereby controlling the characteristic inductance part, while keeping the same predetermined distance between the signal strip and the return conductor by an introduction of at least two non-conducting discontinuities in the return conductor, the at least two discontinuities extend from parts of the return conductor closest to the signal strip and away from the signal strip a length sufficient to controllably increase the nearest distance between the longitudinal currents of the signal strip and the longitudinal currents of the return conductor due to a movement of the longitudinal currents of the return conductor away from the longitudinal currents of the signal strip, the at least two discontinuities extend in such a way as to allow transverse currents between the discontinuities and in that the transmission line comprises a plurality of non-conducting discontinuities distributed along the return conductor, the non-conducting discontinuities are of a width and are spaced apart a center to center distance such that losses due to radiation through the non-conducting discontinuities are avoided or minimized.

2. The transmission line according to claim 1, characterized in that the characteristic impedance of the transmission line is further controlled by varying the lengths of the non-conducting discontinuities within a range so that the nearest distance between the longitudinal currents of the signal strip and the longitudinal currents of the return conductor varies and that a maximum vector of the lengths is less than a width of the return conductor, which maximum vector is perpendicular to the longitudinal currents.

3. The transmission line according to claim 1, characterized in that the characteristic impedance of the transmission line is further controlled by varying the effective facing areas of the signal strip and the return conductor, thereby controlling the characteristic capacitance part, by varying a width of the non-conducting discontinuities.

4. The transmission line according to claim 1, characterized in that the characteristic impedance of the transmission line is further controlled by varying the effective facing areas of the signal strip and the return conductor, thereby controlling the characteristic capacitance part, by varying a center to center distance of the non-conducting discontinuities.

5. The transmission line according to claim 1, characterized in that the non-conducting discontinuities are slots which are at least substantially parallel to the transversal currents.

6. A transmission line with a controllable electrical length, characterized in that the transmission line comprises a transmission line with a controllable characteristic impedance according to claim 1, to thereby control the electrical length.

7. A transmission line based component such as a resonator, matching network, or power splitter, characterized in that the transmission line based component comprises a transmission line according to claim 1.

8. The transmission line according to claim 1, characterized in that the characteristic impedance of the transmission line is further controlled by varying a distance between the non-conducting discontinuities.

9. The transmission line according to claim 8, characterized in that the distance between the non-conducting discontinuities is varied by varying a width of the non-conducting discontinuities closest to the longitudinal currents of the return conductor.

10. The transmission line according to claim 9, characterized in that the widths of the non-conducting discontinuities are varied closest to the longitudinal currents of the return conductor in such a way that the non-conducting discontinuities are wider closest to the longitudinal currents of the return conductor.

11. The transmission line according to claim 1, characterized in that the characteristic impedance of the transmission line is controlled by varying a nearest distance between longitudinal currents of the signal strip and longitudinal currents of the return conductor, thereby controlling the characteristic inductance part, while keeping the same predetermined distance between the signal strip and the return conductor by an introduction of at least two non-conducting discontinuities in the signal strip, the at least two discontinuities of the signal strip extend from parts of the signal strip closest to the longitudinal currents of the return conductor and away therefrom to controllably increase the nearest distance between the longitudinal currents of the signal strip and the longitudinal currents of the return conductor due to a movement of the longitudinal currents of the signal strip away from the longitudinal currents of the return conductor, the at least two discontinuities of the signal strip extend in such a way as to allow transverse currents between the discontinuities.

12. The transmission line according to claim 11, characterized in that the transmission line comprises a plurality of non-conducting discontinuities distributed along the signal strip, the non-conducting discontinuities of the signal strip are of a width and are spaced apart a center to center distance such that losses due to radiation through the non-conducting discontinuities of the signal strip are avoided or minimized.

13. The transmission line according to claim 11, characterized in that the non-conducting discontinuities of the signal strip are matched to the non-conducting discontinuities of the return conductor in such a way as to maximize the effective facing areas of the signal strip to the return conductor.

14. The transmission line according to claim 11, characterized in that the non-conducting discontinuities of the signal strip are slots which are at least substantially parallel to the transversal currents.

15. A method of controlling a characteristic impedance of a transmission line, the transmission line comprising a signal strip and a return conductor spaced apart a predetermined distance, the characteristic impedance comprising a characteristic inductance part and a characteristic capacitance part, the characteristic inductance part being dependent on a distance between longitudinal currents of the signal strip and longitudinal currents of the return conductor, the characteristic capacitance part being dependent on transverse currents on effective facing areas of the signal strip and the return conductor, characterized in that the method comprises controlling a nearest distance between longitudinal currents of the signal strip and longitudinal currents of the return conductor, thereby controlling the characteristic inductance part, while keeping the same predetermined distance between the signal strip and the return conductor by creating at least two non-conducting discontinuities in the return conductor, the at least two discontinuities extending from parts of the return conductor closest to the signal strip and away from the signal strip a length sufficient to controllably increase the nearest distance between the longitudinal currents of the signal strip and the longitudinal currents of the return conductor due to a movement of the longitudinal currents of the return conductor away from the longitudinal currents of the signal strip, the at least two discontinuities extending in such a way as to allow transverse currents between the discontinuities, and distributing a plurality of non-conducting discontinuities along the return conductor of the transmission line, the non-conducting discontinuities being of a width and being spaced apart a center to center distance such that losses due to radiation through the non-conducting discontinuities are avoided or minimized.

16. The method according to claim 15, characterized in that the method further comprises controlling the nearest distance between longitudinal currents of the signal strip and longitudinal currents of the return conductor, thus varying the characteristic inductance part, by varying the lengths of the non-conducting discontinuities within a range so that the nearest distance between the longitudinal currents of the signal strip and the longitudinal currents of the return conductor varies and that a maximum vector of the lengths is less than a width of the return conductor, which maximum vector is perpendicular to the longitudinal currents.

17. The method according to claim 15, characterized in that the method further comprises controlling the effective facing areas of the signal strip and the return conductor, thereby controlling the characteristic capacitance part, by varying a width of the non-conducting discontinuities.

18. The method according to claim 15, characterized in that the method further comprises controlling the effective facing areas of the signal strip and the return conductor, thereby controlling the characteristic capacitance part, by varying a center to center distance of the non-conducting discontinuities.

19. The method according to claim 15, characterized in that the non-conducting discontinuities are slots which are at least substantially parallel to the transversal currents.

20. A method of controlling an electrical length of a transmission line, the transmission line comprising a signal strip and a return conductor spaced apart a predetermined distance, characterized in that the method comprises controlling a characteristic impedance of the transmission line according to claim 15, to thereby control the electrical length of the transmission line.

21. The method according to claim 15, characterized in that the method further comprises controlling the nearest distance between longitudinal currents of the signal strip and longitudinal currents of the return conductor, thus varying the inductance, by varying distances between the non-conducting discontinuities.

22. The method according to claim 21, characterized in that the distances between the non-conducting discontinuities are varied by varying a width of the non-conducting discontinuities closest to the longitudinal currents of the return conductor.

23. The method according to claim 22, characterized in that the widths of the non-conducting discontinuities are varied closest to the longitudinal currents of the return conductor in such a way that the non-conducting discontinuities are wider closest to the longitudinal currents of the return conductor.

24. The method according to claim 15, characterized in that the method further comprises controlling the nearest distance between longitudinal currents of the signal strip and longitudinal currents of the return conductor, thereby controlling the characteristic inductance part, while keeping the same predetermined distance between the signal strip and the return conductor, by creating at least two non-conducting discontinuities in the signal strip, the at least two discontinuities of the signal strip extending from parts of the signal strip closest to the longitudinal currents of the return conductor and away therefrom to controllably increase the nearest distance between the longitudinal currents of the signal strip and the longitudinal currents of the return conductor due to a movement of the longitudinal currents of the signal strip away from the longitudinal currents of the return conductor, the at least two discontinuities of the signal strip extending in such a way as to allow transverse currents between the discontinuities of the signal strip.

25. The method according to claim 24, characterized in that the method comprises distributing a plurality of non-conducting discontinuities of the signal strip along the signal strip of the transmission line, the non-conducting discontinuities of the signal strip being of a width and being spaced apart a center to center distance such that losses due to radiation through the non-conducting discontinuities of the signal strip are avoided or minimized.

26. The method according to claim 24, characterized in that the method comprises matching the non-conducting discontinuities of the signal strip to the non-conducting discontinuities of the return conductor in such a way as to maximize the effective facing areas of the signal strip to the return conductor.

27. The method according to claim 24, characterized in that the non-conducting discontinuities of the signal strip are slots which are at least substantially parallel to the transversal currents.

* * * * *